US012258262B2

(12) United States Patent
Okano

(10) Patent No.: US 12,258,262 B2
(45) Date of Patent: Mar. 25, 2025

(54) SUBSTRATE AND MICROPHONE UNIT

(71) Applicant: HOSIDEN CORPORATION, Osaka (JP)

(72) Inventor: Shingo Okano, Osaka (JP)

(73) Assignee: HOSIDEN CORPORATION, Osaka (JP)

( * ) Notice: Subject to any disclaimer, the term of this patent is extended or adjusted under 35 U.S.C. 154(b) by 605 days.

(21) Appl. No.: 17/607,696

(22) PCT Filed: May 13, 2020

(86) PCT No.: PCT/JP2020/019048
§ 371 (c)(1),
(2) Date: Oct. 29, 2021

(87) PCT Pub. No.: WO2020/235408
PCT Pub. Date: Nov. 26, 2020

(65) Prior Publication Data
US 2022/0219968 A1 Jul. 14, 2022

(30) Foreign Application Priority Data

May 23, 2019 (JP) ................. 2019-096833

(51) Int. Cl.
B81B 3/00 (2006.01)
H04R 19/00 (2006.01)
H04R 19/04 (2006.01)

(52) U.S. Cl.
CPC .... *B81B 3/0008* (2013.01); *B81B 2201/0257* (2013.01); *B81B 2203/0353* (2013.01);
(Continued)

(58) Field of Classification Search
CPC .................. H04R 19/005; H04R 19/04; B81B 2201/0257
See application file for complete search history.

(56) References Cited

U.S. PATENT DOCUMENTS 7,436,054 B2 * 10/2008 Zhe .................... H01L 24/83
438/51
9,794,661 B2 * 10/2017 Watson .................. H04R 17/02
(Continued)

FOREIGN PATENT DOCUMENTS

| CN | 108141679 A | 6/2018 |
|---|---|---|
| JP | 2007-060661 | 3/2007 |

(Continued)

OTHER PUBLICATIONS

Chinese Office Action in counterpart Chinese Application No. 202080037760.3, dated Feb. 28, 2024 (along with English translation).

(Continued)

*Primary Examiner* — Jeremy A Luks
(74) *Attorney, Agent, or Firm* — Greenblum & Bernstein, P.L.C.

(57) ABSTRACT

The present invention provides a substrate that is highly resistant to ESD, on which a reverse sound hole type MEMS microphone can be mounted. The substrate has one surface connected to a MEMS microphone, and comprises a substrate sound hole that penetrates through the substrate and communicates with a sound hole of the MEMS microphone, and a GND pad disposed around the substrate sound hole on another surface of the substrate.

15 Claims, 3 Drawing Sheets

(52) U.S. Cl.
CPC ...... *B81B 2207/096* (2013.01); *H04R 19/005* (2013.01); *H04R 19/04* (2013.01)

(56) References Cited

U.S. PATENT DOCUMENTS

| | | | |
|---|---|---|---|
| 2007/0013052 A1* | 1/2007 | Zhe | H01L 23/552 |
| | | | 257/E23.114 |
| 2007/0041597 A1 | 2/2007 | Song | |
| 2009/0092274 A1* | 4/2009 | Song | H04R 31/006 |
| | | | 381/361 |
| 2010/0246877 A1* | 9/2010 | Wang | B81B 7/0061 |
| | | | 381/361 |
| 2011/0013787 A1 | 1/2011 | Chang | |
| 2011/0158453 A1* | 6/2011 | Tanaka | H04R 19/04 |
| | | | 381/361 |
| 2012/0300969 A1 | 11/2012 | Tanaka et al. | |

FOREIGN PATENT DOCUMENTS

| | | |
|---|---|---|
| JP | 2009/147470 A | 7/2009 |
| JP | 2011-155450 | 8/2011 |
| JP | 2015-029182 | 2/2015 |
| WO | WO2017/027242 A1 | 2/2017 |

OTHER PUBLICATIONS

India Examiner Report, India Patent Office, Application No. 202117052006, issued May 23, 2022 (with English translation).
International Search Report issued in International Bureau of WIPO Patent Application No. PCT/JP2020/019048, dated Jul. 21, 2020.
Chinese Office Action in counterpart Chinese Application No. 202080037760.3, dated Sep. 30, 2024 (along with English translation).

* cited by examiner

SUBSTRATE AND MICROPHONE UNIT

TECHNICAL FIELD

The present invention relates to a substrate protected against electrostatic discharge (ESD), and a microphone unit.

BACKGROUND ART

Patent literature 1 and 2 are examples of technologies of the related art regarding a method of implementing a micro-electro-mechanical systems (MEMS) microphone. In Patent literature 1 and 2, a substrate sound hole that communicates with a sound hole of a MEMS microphone is provided on a substrate on which a reverse sound hole type MEMS microphone is mounted.

PRIOR ART LITERATURE

Patent Literature

Patent literature 1: Japanese Patent Application Laid-Open No. 2015-029182
Patent literature 2: Japanese Patent Application Laid-Open No. 2007-060661

SUMMARY OF THE INVENTION

Problems to be Solved by the Invention

MEMS microphones are devices that are vulnerable to ESD by static electricity, and reverse sound hole type MEMS microphones in particular are structured such that the sound collector is exposed through the sound hole, and if the sound hole is blocked, the sound collecting function is no longer achieved. However, the substrates disclosed in Patent literature 1 and 2 are not provided with any countermeasures against static electricity. Note that in Patent literature 1 and 2, the area around the sound hole of the MEMS microphone and the substrate sound hole are connected by a ground land and a ceiling terminal, but this is for the purpose of keeping the sound hole of the MEMS microphone close to the substrate sound hole, and these components do not provide protection against static electricity.

In the related art, when using a reverse sound hole type MEMS microphone, it is necessary to provide a structure that does not receive static electricity directly. For example, it is necessary to use a sound conduit to provide the MEMS microphone at a position that does not receive static electricity directly or provide a mesh (garnish/grill) on top of the MEMS microphone, and such measures may impose constraints on design or lead to increased costs due to the additional parts.

Accordingly, an object of the present invention is to provide a substrate that is highly resistant to ESD, on which a reverse sound hole type MEMS microphone can be mounted.

Means to Solve the Problems

A substrate according to the present invention has one surface connected to a MEMS microphone, and comprises a substrate sound hole and a GND pad. The substrate sound hole penetrates through the substrate and communicates with a sound hole of the MEMS microphone. The GND pad is disposed around the substrate sound hole on another surface of the substrate.

Effects of the Invention

The substrate according to the present invention is highly resistant to ESD, and a reverse sound hole type MEMS microphone can be mounted thereon.

DETAILED DESCRIPTION OF THE EMBODIMENT

Hereinafter, an embodiment of the present invention will be described in detail. Note that structural elements having the same function are denoted with the same signs, and duplicate description of such elements is omitted.

First Embodiment

Figure 1:
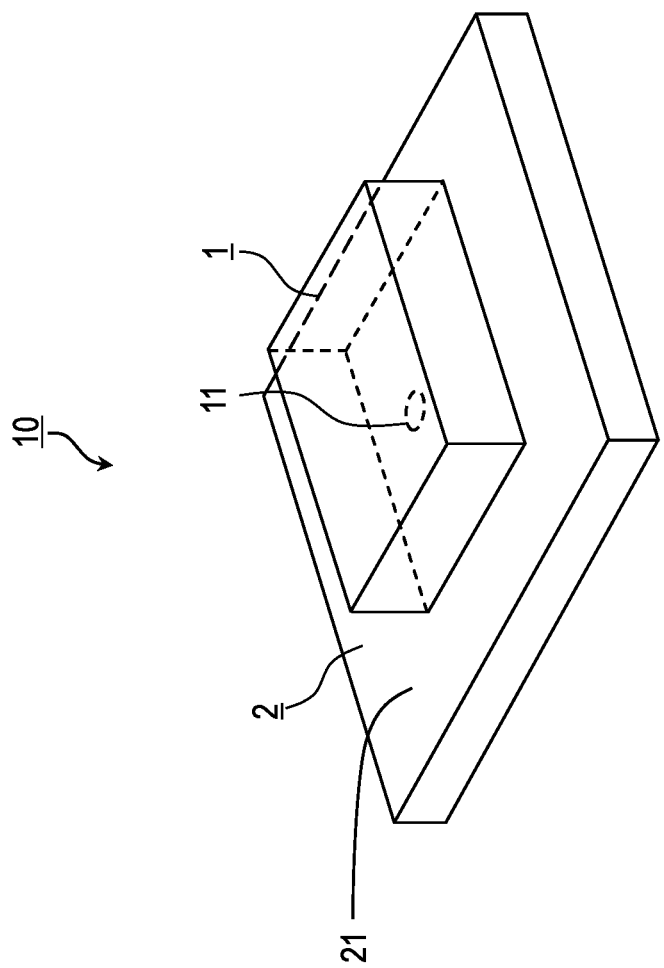
FIG. 1 is a schematic view of a microphone unit according to a first embodiment.

Hereinafter, a configuration of a microphone unit according to the first embodiment will be described with reference to FIG. 1. As illustrated in the diagram, a microphone unit 10 according to the present embodiment comprises a reverse sound hole type MEMS microphone 1 and a printed substrate 2. The MEMS microphone 1 includes a sound hole 11. The MEMS microphone 1 is connected to one surface (referred to as the microphone connection surface 21) of the printed substrate 2.

Figure 2:
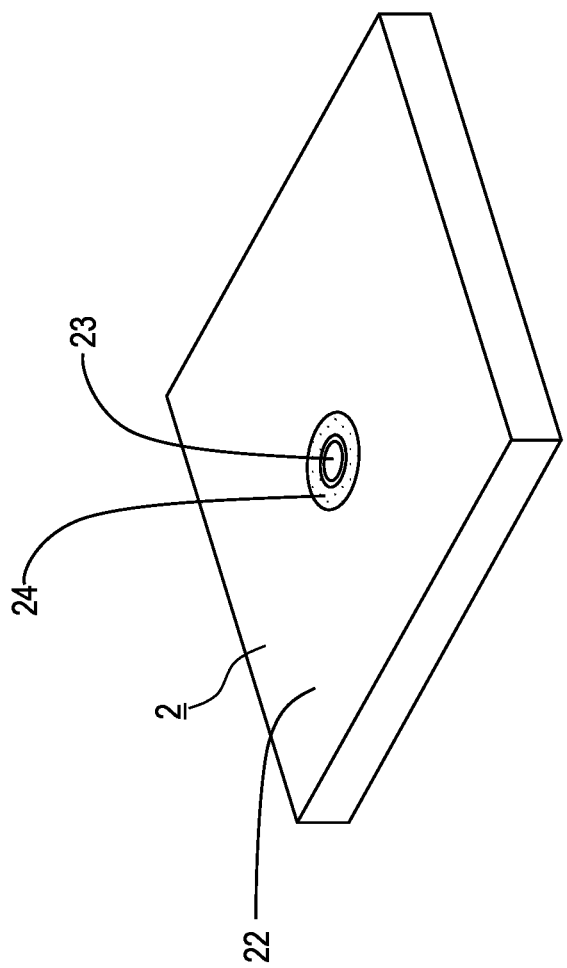
FIG. 2 is a schematic view of a substrate according to the first embodiment.

Hereinafter, the structure of the printed substrate 2 will be described with reference to FIG. 2. As illustrated in the diagram, the substrate 2 includes a substrate sound hole 23 and a GND pad 24. The substrate sound hole 23 penetrates through the substrate 2 and communicates with the sound hole 11 of the MEMS microphone 1. The GND pad 24 is provided around the substrate sound hole 23 on another surface (referred to as the ESD protection surface 22) of the substrate 2 so as to surround the substrate sound hole 23. In the example illustrated in the diagram, the GND pad 24 has a ring (circular) shape that surrounds the substrate sound hole 23, but the present invention is not limited thereto. For example, the GND pad 24 may also have a square frame shape provided so as to surround the substrate sound hole 23. In addition, the GND pad 24 may have any other polygonal frame shape (such as a triangular, hexagonal, octagonal, . . . frame shape) provided so as to surround the substrate sound hole 23. Note that excess solder may also be provided on the GND pad 24. By providing excess solder, the GND volume is increased, thereby enhancing the effect of sending static electricity to GND. Note that the substrate sound hole 23 may also be configured as a through-hole or a via hole. By configuring the substrate sound hole 23 as a through-hole or a via hole, the GND surface area is increased, thereby enhancing the effect of sending static electricity to GND.

<Advantageous Effects of the First Embodiment>

According to the substrate 2 and the microphone unit 10 of the present embodiment, because static electricity is sent to the GND pad 24, the diffusion of static electricity to the substrate GND can be prevented without needing to provide additional parts such as a sound conduit or a mesh (garnish/grill), and constraints on the design or increased costs due to additional parts do not occur. Also, if a structure that covers the space in the front part (anterior chamber) of the sound hole with a housing, mesh, or the like is provided, the problem of an unwanted dip in the upper range of the frequency characteristics of the microphone has also occurred in the past, but according to the substrate 2 and the microphone unit 10 of the present embodiment, it is not necessary to cover the space in the front part (anterior chamber) of the sound hole, and consequently, more stable microphone acoustic characteristics can be achieved.

[First Modification]

Figure 3:
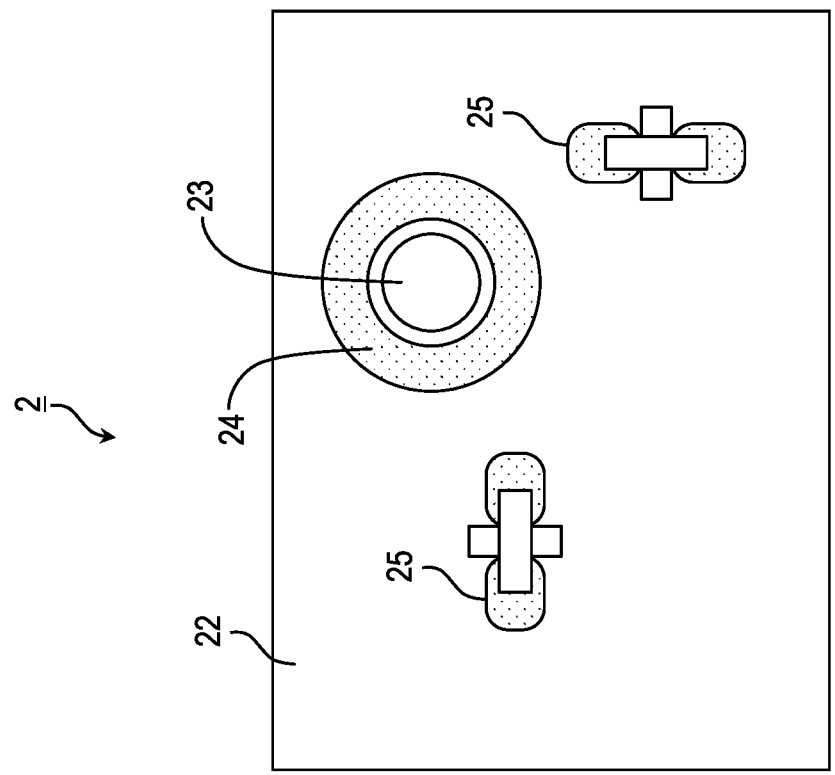
FIG. 3 is a schematic view of a substrate according to a first modification.

As illustrated in FIG. 3, one or multiple chip components 25 having the GND potential may also be provided on the ESD protection surface 22 side of the substrate 2, near the substrate sound hole 23 and the GND pad 24. By disposing the chip components 25 having the GND potential near the substrate sound hole 23 and the GND pad 24, a lightning rod effect is obtained, and the ESD resistance can be raised.

The substrate disclosed in the foregoing embodiment and modification is not limited to a MEMS microphone, and is applicable in general to substrates on which electronic components vulnerable to static electricity are mounted.

What is claimed is:

1. A substrate having one surface connected to a MEMS microphone, comprising:
   a substrate sound hole that penetrates through the substrate and communicates with a sound hole of the MEMS microphone;
   a GND pad which has a circular ring shape disposed around the substrate sound hole on another surface of the substrate, wherein the GND pad is not a pad used for connecting to other components on a solder surface thereof; and
   an excess solder that is provided on the GND pad, wherein the excess solder is not connected to the other components.

2. The substrate according to claim 1, wherein the substrate sound hole is a through-hole or a via hole.

3. The substrate according to claim 1, further comprising: a chip component disposed near the GND pad on the other surface of the substrate.

4. The substrate according to claim 2, further comprising: a chip component disposed near the GND pad on the other surface of the substrate.

5. The substrate according to claim 1, wherein the excess solder is provided on an outward face of the GND pad.

6. A microphone unit comprising:
   a MEMS microphone;
   a substrate having one surface connected to the MEMS microphone;
   a substrate sound hole that penetrates through the substrate and communicates with a sound hole of the MEMS microphone;
   a GND pad which has a circular ring shape disposed around the substrate sound hole on another surface of the substrate, wherein the GND pad is not a pad used for connecting to other components on a solder surface thereof; and
   an excess solder that is provided on the GND pad, wherein the excess solder is not connected to the other components.

7. The microphone unit according to claim 6, wherein the substrate sound hole is a through-hole or a via hole.

8. The microphone unit according to claim 6, further comprising:
   a chip component disposed near the GND pad on the other surface of the substrate.

9. The microphone unit according to claim 7, further comprising:
   a chip component disposed near the GND pad on the other surface of the substrate.

10. The microphone unit according to claim 6, wherein the excess solder is provided on an outward face of the GND pad.

11. A substrate having one surface connected to an MEMS microphone, comprising:
    a substrate sound hole that penetrates through the substrate and communicates with a sound hole of the MEMS microphone,
    a GND pad disposed around the substrate sound hole on another surface of the substrate, wherein the GND pad is not a pad used for connecting to other components on a solder surface thereof; and
    an excess solder that is provided on the GND pad, wherein the excess solder is not connected to the other components.

12. A substrate having one surface connected to an MEMS microphone, comprising:
    a substrate sound hole which is configured as a through-hole or a via hole, that penetrates through the substrate and communicates with a sound hole of the MEMS microphone;
    a GND pad disposed around the substrate sound hole on another surface of the substrate, wherein the GND pad is not a pad used for connecting to other components on a solder surface thereof; and
    an excess solder that is provided on the GND pad, wherein the excess solder is not connected to the other components.

13. A substrate having one surface connected to an MEMS microphone, comprising:
    a substrate sound hole that penetrates through the substrate and communicates with a sound hole of the MEMS microphone,
    a GND pad disposed around the substrate sound hole on another surface of the substrate, wherein the GND pad is not a pad used for connecting to other components on a solder surface thereof;
    an excess solder that is provided on the GND pad, wherein the excess solder is not connected to the other components; and
    a chip component having a GND potential is disposed near the GND pad on the another surface of the substrate.

14. A substrate having a first surface configured as a microphone connection surface and being connected to a MEMS microphone and a second surface opposite the first surface configured as an electrostatic discharge (ESD) protection surface, the substrate comprising:
    a substrate sound hole that penetrates through the substrate and communicates with a sound hole of the MEMS microphone;
    a GND pad disposed around the substrate sound hole on the ESD protection surface of the substrate and operable to send static electricity to ground, wherein the GND pad is flush with the second surface, and wherein the GND pad is not a pad used for connecting to other components on a solder surface thereof; and an excess solder that is provided on the GND pad, wherein the excess solder is not connected to the other components.

15. A microphone unit comprising:

a MEMS microphone, the MEMS microphone having a sound hole a substrate having a first surface configured as a microphone connection surface and connected to the MEMS microphone;

the substrate having a second surface opposite the first surface and being configured as an electrostatic discharge (ESD) protection surface;

a substrate sound hole that penetrates through the substrate and communicates with the sound hole of the MEMS microphone;

a GND pad disposed around the substrate sound hole on the ESD protection surface and operable to send static electricity to ground, wherein the GND pad is flush with the second surface, and wherein the GND pad is not a pad used for connecting to other components on a solder surface thereof; and an excess solder that is provided on the GND pad, wherein the excess solder is not connected to the other components.

\* \* \* \* \*